United States Patent [19]  [11] Patent Number: 4,457,972
Griffith et al. [45] Date of Patent: Jul. 3, 1984

[54] ENHANCED ADHESION BY HIGH ENERGY BOMBARDMENT

[75] Inventors: Joseph E. Griffith, Pasadena, Calif.; Yuanxun Qiu, Shanghi, China; Thomas A. Tombrello, Altadena, Calif.

[73] Assignee: California Institute of Technology, Pasadena, Calif.

[21] Appl. No.: 327,896

[22] Filed: Dec. 7, 1981

[51] Int. Cl.³ .................... B32B 7/04; B32B 15/04
[52] U.S. Cl. .................... 428/334; 156/272.2; 156/273.9; 427/38; 427/43.1; 428/209; 428/335; 428/336; 428/420; 428/422; 428/433; 428/434; 428/446; 428/457; 428/461; 428/463; 428/901; 428/450; 29/900; 430/318; 376/158; 376/190
[58] Field of Search .............. 427/38; 428/422, 433, 428/434, 461, 463, 469, 457, 901, 209, 420, 411, 446, 334–336; 156/272.2, 273.9

[56] References Cited
U.S. PATENT DOCUMENTS 3,296,011  1/1967  McBride ............................ 428/422
3,309,221  3/1967  Smith ................................ 428/422
3,682,729  8/1972  Gukelberger, Jr. et al. ....... 428/209
4,256,780  3/1981  Gaerttner ........................... 427/38

FOREIGN PATENT DOCUMENTS 816024  3/1957  United Kingdom .

Primary Examiner—Ellis P. Robinson
Attorney, Agent, or Firm—Marvin E. Jacobs

[57] ABSTRACT

Films (12) of gold, copper, silicon nitride, or other materials are firmly bonded to insulator substrates (12) such as silica, a ferrite, or Teflon (polytetrafluoroethylene) by irradiating the interface with high energy ions. Apparently, track forming processes in the electronic stopping region cause intermixing in a thin surface layer resulting in improved adhesion without excessive doping. Thick layers can be bonded by depositing or doping the interfacial surfaces with fissionable elements or alpha emitters.

22 Claims, 6 Drawing Figures

ENHANCED ADHESION BY HIGH ENERGY BOMBARDMENT

ORIGIN OF THE INVENTION

The invention described herein was made in the performance of work under contracts with the National Science Foundation and with NASA and is subject to the provisions of Section 305 of the NASA Act of 1958, Public Law 85-568 (72 Stat. 435; 42 USC 2457) and to the provisions of the NSF Act.

BACKGROUND OF THE INVENTION

The present invention relates to direct adhesion of materials and, more particularly, to improving the adhesion of a film of a material to an electrical insulator by irradiating the interface between the surfaces with high energy ions.

Though the invention is of general application in its ability to enhance the adhesion of any material, whether conductor or insulator, to an insulator substrate, there are many insulator substrates that do not form stable, adherent bonds even with pretreatment of the surface or use of adhesives. For example, it is very difficult to bond metal films such as gold or silver to refractory substrates such as quartz. It is also difficult to permanently apply metal or even printing inks to synthetic polymeric materials such as hydrocarbon polymers, for example polyethylene or polyfluorocarbon materials such as Teflon (polytetrafluoroethylene). Metal films applied to these surfaces by evaporation form very weakly adherent bonds and the films can be readily peeled off the surfaces.

There are many applications where the service life of the device is severely limited by the nonpermanence of a coating on an insulator, for example, low and high powered laser mirrors or mirror coatings used in ordinary and celestial telescopes. Many small and intricately shaped devices such as ferrite heads for reading tapes and magnetically coded discs are difficult to coat. Other products currently being produced and/or developed that require bonding of a thin film of metal to an insulator substrate are printed circuit boards, integrated circuits and semiconductors such as photovoltaic cells.

DESCRIPTION OF PRIOR ART

Ion-beam-induced atomic mixing is a well known technique for improving the bonding at an interface between dissimilar materials. For many years it has been widely known that bombarding the interface between two materials with low energy ions in the nuclear stopping region ($E \lesssim$ a few KeV/amu) causes the two media to intermix and usually results in an improved bond. However, these processes, which are associated with sputtering, result in disruption of the film and the beam particles have a short path after reaching the interface resulting in contamination or doping of one or the other of the materials at the interface. The low energy beams are limited to use with very thin layers of material and cause a violent disruption of metallic layers. The method is limited to treating small surface areas, and is not capable of bonding metal films to certain industrially important insulator substrates such as ferrites, quartz, polyethylene or Teflon (polytetrafluoroethylene).

DISCLOSURE OF THE INVENTION

It has now been discovered in accordance with this invention that high energy bombardment ($E \gtrsim 100$ KeV/amu; where amu is an abreviation for atomic mass unit) of an interface including at least one insulator material results in enhanced adhesion of the surfaces. The process appears to operate through an entirely different mechanism than experienced with low energy bombardment. The mechanism appears to be associated with track-forming processes occurring in the electronic stopping region for the bombarding ion.

Though the mechanism that produces the bonding is not understood, it is apparently associated with the sputtering mechanism that operates in this high energy range. Enhanced bonding should appear in the electronic stopping region only if one or both of the media are electrical insulators, and the greatest adhesion is achieved when the incident ion is near peak of the electronic stopping power. The moving atoms in the disrupted medium have energies that are much lower than those generated in the collision cascades produced by low energy ions. If there is mixing at the interface, the mixed layer should not be very thick. Analysis of the sputtered atoms suggest that the spike produced by the incident particle can be characterized by a temperature—typically a few thousand degrees Kelvin. Perhaps the improved bond can be in the form of a spot weld. The high energy mechanism has several advantages over the low energy one. The high energy particles penetrate much deeper into a solid, which allows the technique to be used with thick films while minimizing doping effects at the interface. In addition, a high energy beam of ions does not disrupt a metallic layer as violently as a low energy one. In particular, the high energy beam does not sputter away the metallic film while the low energy beam does. Furthermore, the high energy mechanism is in some cases extraordinarily efficient. For example, a gold film can be bonded to a polyfluorocarbon polymer such as Teflon with a fluence of as little as $10^{13}/cm^2$ of 1 MeV $^4$He ions. Finally, the ions used in some of the high energy cases can be produced with radioactive nuclei such as alpha emitters and fissionable elements, thus, obviating the need for an accelerator. Moreover, an interface deep within a sample could be doped with the appropriate material, which would produce the desired result through spontaneous or neutron induced emission of energetic ions. This would permit bonding of extremely large surfaces quickly and inexpensively.

The process of the invention lends itself to simple but important applications. There are many situations in which it is necessary to bond a good conductor to an insulator: printed circuit boards, integrated circuits, mirrors, ferrite heads for tape and disc drives, etc. Since many protective coatings such as paints are insulators, the properties of protected surfaces could be improved after the coating has been applied. The process could also be used to bond insulators to insulators for applications such as coated optics. Metallization of polymers is probably the easiest application, since high energy He beams can be produced with a modest apparatus. A one milliamp alpha beam could bond metals to Teflon at a rate of over 150 cm$^2$/sec. Nuclear reactions and alpha emitters could also be used to perform the bombardments. For instance, in a nuclear reactor the $10_B(n,a)^7Li$, $Li^6(n,a)T$, $^3He(n,p)T$, and $^{235}U(n,f)$ reactions could be used to process metallized polymers with very large surface areas. Since neutrons can penetrate deep into a solid, the process is not limited to bonding thin films to substrates. In addition, high energy ion beams have advantages over low energy ion-induced mixing. The beam particles travel far beyond the bonded interface so they do not contaminate it. Furthermore, a high energy ion beam would not sputter away the metal film as a low energy beam would. In many ways this high energy mechanism could be more convenient to use than low energy ion techniques.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1:
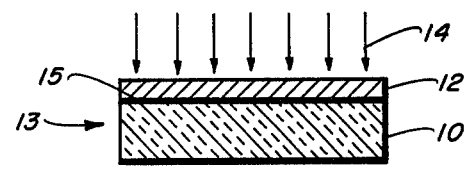
FIG. 1 is a schematic view of a first embodiment of a process for adhering a film to a substrate according to this invention.
Figure 2A:
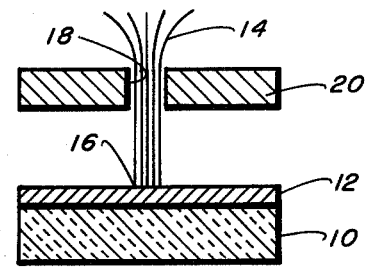
FIGS. 2a and 2b are schematic views of another embodiment of the invention for adhering a portion of the film to the surface of an insulator substrate.
Figure 2B:
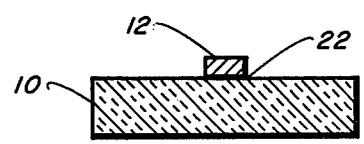
Figure 3A:
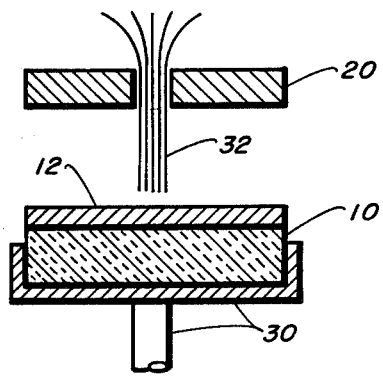
FIGS. 3a and 3b are schematic views of a further embodiment of a system for selectively adhering a film to a substrate.
Figure 3B:
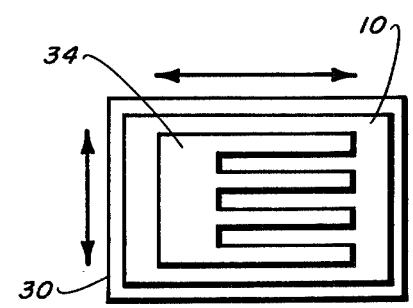

In its simplest form, an insulator substrate 10 is first coated with a film 12 such as a film of metal. The coated substrate 13 is then subjected to high energy bombardment which penetrates to the interface 15 and results in firm adherence of the film 12 to the substrate 10. As illustrated in FIG. 2, less than all of the film 12 may be adhered to the substrate 10 by restricting the beam to a narrow line 16 suitably by passing the beam 14 through the opening 18 in a collimator or focussing assembly 20. The non-irradiated areas are easily removed to provide a firmly adherent line 22 on the substrate 10.

Another means of selectively writing and adhering a line of film on the substrate 10 is to mount the substrate 10 in a fixture 12 connected to a translation means 30 or the irradiation source can be connected to a translation means, not shown. The collimated beam 32 is then applied to the moving substrate 10. After removal of the non-irradiated, non-adherent portion of the film, a pattern 34 such as an electrode comb pattern remains on the substrate 10.

Figure 4:
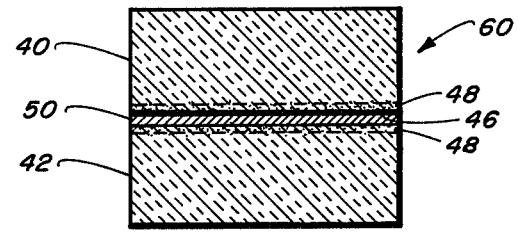
FIG. 4 is a schematic view of a system for adhering relatively thick bodies of material.

FIG. 4 illustrates a method of adhering relatively thick materials 40, 42 or materials having complex shapes. The ions can be produced directly at the interface 46 by doping either one or both surfaces with radioactive nuclei 48 such as alpha emitters, fissionable elements and nuclei that undergo neutron induced reactions that produced charged particles. Ions are produced through spontaneous or neutron induced emission of energetic ions from the nuclei. This avoids the need to utilize an accelerator. Any of these methods, and particularly the system of FIG. 4, can be utilized to bond a three layer sandwich. A thin film 50 could be interposed between materials 40 and 42 on generation of high energy ions which penetrate the film and invade the surface of each of the materials 40, 42, a firmly adherent three layer laminate 60 is produced.

At least one of the materials at the interface must be an electrical insulator having a resistivity greater than $10^3$ ohm-cm. Previous research with respect to high energy sputtering in the electronic stopping region has determined that the thermal diffusivity of the insulator material is not important. The insulator material can be an organic resin, or an inorganic refractory, ceramic or glass. The invention is particularly advantageous with the difficult to coat materials such as silica, whether amorphous or crystalline, ferrites and inert plastic materials such as polyfluorocarbons, for example Teflon (polytetrafluoroethylene), silicone polymers such as polydimethylsiloxane and polyolefins such as polyethylene or polypropylene. Though the thickness of the coating is not critical, the coating should be transparent to the high energy ion beam or to the beam utilized to generate high energy ions from suitable nuclei deposited onto or doped into the interface.

The other material forming the interface can be the same insulator, a different insulator, or can be an electric conductor. In many cases the second material will be a thin (a monolayer to 20 mils in thickness) coating of a metal such as gold, nickel, chromium, copper, platinum, palladium, rhodium, tantalum, aluminum or silver, forming the electrodes or the printed lines of a printed circuit or an integrated circuit. The invention is particularly applicable to the noble metals that are most stable, that is, do not form oxides at room temperature, since these metals are the most difficult to deposit and form adherent bonds on substrates such as quartz, silica or organic resin surfaces. There is no need to utilize the invention with easily deposited metals such as titanium which readily forms adherent bonds with quartz or other substrates.

The operating conditions and parameters do not appear to be critical except for the insulator nature of one of the surfaces and the minimum energy requirements of the irradiating beam. The threshold energy appears to be related to velocity at the interface. The velocity of the ion appears to be adequate for effecting the bonding mechanism of the invention if the ions have an energy of at least 0.1 MeV/amu. If the energy is too great, the surface can be disrupted or burned and unnecessary amounts of energy are utilized. Energies greater than 20 MeV/amu are not advisable. Certain substrates are more difficult to coat and adhere to than others. For example, with quartz, the run times have to be longer or more massive ions such as chlorine or fluorine are required. The velocities necessary for enhanced deposition can be generated with protons, helium, chlorine or fluorine ions hving energies from 1 to 20 million electron volts (MeV) per atomic mass unit (amu) and a dosage of at least $10^{12}$ ions per square centimeter.

The coating or adhering process is operated at ambient temperature. The pressure during irradiation can be reduced to avoid extraneous collisions between the energetic ions and molecules in the gas phase between the ion source and the coated substrate. The ions can be generated by a small accelerator. It is not difficult to generate 1 MeV alphas. A Van de Graaff accelerator can generate high energy ions from any ion such as those from chlorine, fluorine, or helium or other noble gases such as neon, argon or krypton. It may be advantageous to employ a bombarding ion that is the same as the substrate so that no contamination occurs. It has further been discovered that the quality of the bond improves by allowing the assembly to age at ambient conditions for at least one day after irradiation. Much thicker materials can be treated in the process of the invention by disposing an alpha emitter layer or doping one or other or both of the interfacial surfaces with elements such as boron, which is capable of emitting high energy charged particles under neutron bombardment through the nuclear reaction $10_B(n,a)^7Li$. On bombardment of $10_B$ with neutrons, 2 MeV alphas (a) are emitted which will enter the insulator and form tracks or lattice disruptions or perturbations resulting in adherence of the doped surface to the adjoining surface. Other elements that can be doped into or coated onto the surfaces are fissionable elements such as $U^{235}$. The use of micro-beam accelerators can also be used to localize adhesion to small areas such as the ferrite heads used for reading magnetic memory discs.

The following experiments were conducted by generating high energy protons, helium, chlorine and fluorine ion beams from the ONR-CIT tandem accelerator. The beam spot was defocussed in most cases to a horizontal stripe 1 cm long and 0.1 cm wide. The beam spot dose was uniform within a factor of 2.

The substrates were commercial grade Teflon, sapphire, nickel-zinc ferrite, fused quartz and soda-lime glass. The substrates were cleaned with trichloroethylene, nitric acid and methanol before being loaded into a diffusion-pumped evaporator. 200 Å–500 Å thick films of gold or copper were evaporated onto the substrates in a vacuum of $1 \times 10^{-6}$ Torr. $Si_3N_4$ films on Si were formed by sputter deposition in an RF discharge sputtering chamber. After irradiation the adhesion of the films were tested by means of the "Scotch Tape Test": a piece of tape was firmly pressed on the irradiated surface and slowly peeled off by hand. The adhesion effect obtained after the high energy bombardment is so dramatic that more quantitative tests of adhesion were not necessary.

Enhanced bonding has been easiest to produce with Au on Teflon.

EXAMPLE 1

A fluence of $3-4 \times 10^{13}/cm^2$ He at 1 MeV produces a strong bond. A 500 Å Au film on Teflon was bombarded wit 1 MeV alpha particles at fluences of $2 \times 10^{13}/cm^2$, $4 \times 10^{13}/cm^2$ and $8 \times 10^{13}/cm^2$. The beam currents were about 150 nA/cm² (+1 charge state), which allowed irradiation times of 2 min. or less. The power delivered by the beam was approximately 0.15 watt/cm². The tape easily pulled the Au from the unirradiated areas. The Au did not adhere to the central region of the highest fluence spot and showed some evidence of burning with $8 \times 10^{13}$ dose rate. The non-uniform beam tended to be more intense in the center. Teflon cannot withstand fluences that are too high; doses above $5 \times 10^{13}/cm^2$ do not produce improved adhesion at 1 MeV incident energy and 150 nA/cm² incident beam current. A fluence of $1 \times 10^{13}/cm^2$ did not produce enhanced bonding when tested immediately after the irradiation, but when tested five days later it produced bonding comparable to the slightly higher doses. Why the apparent improvement appears after aging in air at room temperature is not known; the result may be produced by variations in the adhesion of the tape to the Au film. F beams at 5 MeV were also found to improve the bonding at fluences about $3 \times 10^{12}/cm^2$. 2 MeV protons produced excellent adhesion of gold to Teflon at a dose of about $5 \times 10^{14}/cm^2$. A lower proton energy would probably have permitted a lower fluence.

EXAMPLE 2

The bonding of Au to $SiO_2$ was also enhanced by using a heavier particle, Cl. This beam was chosen because it is the heaviest one available from the ONR-CIT tandem accelerator; Ar would have worked just as well. Cl at 20 MeV dramatically improved the bonding with a fluence of $1 \times 10^{15}/cm^2$. A fluence of $5 \times 10^{14}/cm^2$ produces an effect that is just barely observable with the Scotch Tape Test. Aging the irradiated sample for two weeks in air at room temperature substantially improved the tape test result for $1 \times 10^{15}/cm^2$. Fluorine irradiation had no influence on this combination at doses up to $1 \times 10^{15}/cm^2$. Thus the bonding exhibits a threshold not only in the fluence but also in the atomic number of the incident particle. This behavior is similar to that found with registration thresholds found in nuclear track production, a phenomenon which is probably related to the bonding mechanism.

EXAMPLE 3

Au was also evaporated onto a 2000 Å $SiO_2$ film on a Si substrate. The results from Cl bombardment of this film on a film were identical to those from the bulk $SiO_2$ samples.

EXAMPLE 4

Tests of Au on glass and of $Si_3N_4$ on Si produced enhancements that were not as dramatic as on the previous systems. In both cases Cl beams were utilized. 20 MeV Cl at $1 \times 10^{15}/cm^2$ just barely produced improved bonding onto the glass substrate only after the irradiated spot had aged in air at room temperature for two weeks. Some of the $Si_3N_4$ films adhered to Si quite well without any help from ion beams. One batch that did not adhere well, however, was bonded to the Si strongly enough to pass the tape test using Cl at 20 MeV and 5 MeV with a fluence of $1 \times 10^{15}/cm^2$.

EXAMPLE 5

Very high doses of 20 MeV Cl improved the bonding of Au and Cu to sapphire. A fluence of about $1 \times 10^{16}/cm^2$ was required before the gold adhered sufficiently to pass the tape test and a fluence of about $3 \times 10^{15}/cm^2$ before the bonding enhancement of copper was sufficient to pass the test.

EXAMPLE 6

The best behaved system occurred on studying the adherence of gold to a nickel-zinc ferrite. Bombardment of the gold coated ferrite with beams of 5 MeV F at $2 \times 10^{15}/cm^2$ and 20 MeV Cl at $3 \times 10^{13}/cm^2$ produced a strong bond over a wide range of fluences of either beam.

The process of the invention can be utilized to bond thin film metal coatings to substrates such as mirrors or printed circuit boards, especially boards utilized in high frequency applications which require use of Teflon. Bonding of paints or other resin films to metal or insulator substrates can be enhanced by irradiating the painted or coated surface with high energy ions. Certain inert substrates such as stainless steel cannot be painted since primers will not adhere to the surface. The invention can also be utilized to adhere ink to a substrate. It is very difficult to print on polyethylene or polyfluorocarbons. Since high energy ion beams can be focussed to a micron or less the process can be utilized to write an integrated circuit on an insulator substrate. Very fine or tiny capacitors can be fabricated by irradiating a metal-resin-metal sandwich such as gold-Teflon-gold.

It is to be realized that only preferred embodiments of the invention have been described and that numerous substitutions, modifications and alterations are permissible without departing from the spirit and scope of the invention as defined in the following claims.

We claim:

1. A method of improving the adhesion of a first surface to a surface of an electrical insulator having a resistivity exceeding $10^3$ ohm-cm comprising the steps of:
bringing two surfaces into contact; and
applying high energy ions having an energy of at least 0.1 MeV/amu to the insulator for a time sufficient to improve adhesion.

2. A method according to claim 1 in which the ions have a dose of at least $10^{12}/cm^2$.

3. A method according to claim 1 in which the first surface is a thin film of metal.

4. A method according to claim 3 in which the metal is gold having a film thickness of from one monolayer to 20 mils.

5. A method according to claim 4 in which the insulator is selected from inorganic or organic materials.

6. A method according to claim 5 in which the insulator is silica.

7. A method according to claim 5 in which the insulator is a ferrite.

8. A method according to claim 5 in which the insulator is an organic resin.

9. A method according to claim 8 in which the resin is selected from polyfluorocarbons and polyolefins.

10. A method according to claim 9 in which the resin is polytetrafluoroethylene.

11. A method according to claim 1 in which the radiation is selectively applied to portions of the interface between said surfaces.

12. A method according to claim 11 further including the step of removing the non-adhered, non-irradiated portions from the surface of the insulator.

13. A method according to claim 11 in which the irradiated pattern is in the form of a printed circuit.

14. A method according to claim 13 in which the pattern is in the form of an integrated circuit.

15. A method according to claim 1 in which the ions are generated at the interface.

16. A method according to claim 15 in which the ions are generated by disposing fissionable elements or compounds that undergo nuclear reactions having charged particles as the reaction product, or neutron activatible, charged particle emitting compounds at said surface.

17. A method according to claim 16 in which said elements or compounds are doped into one of said surfaces.

18. A laminate comprising:
a first electrical insulator layer having a resistivity exceeding $10^3$ ohm-cm; and a directly abutting, a second layer adhered to the first layer by means of a mixed interface formed by applying high energy ions having an energy of at least 0.1 MeV/amu to said interface.

19. A laminate according to claim 18 in which the insulator is silica or a synthetic resin and the second layer is a film of noble metal having a thickness from 10 Å to 20 mil.

20. A laminate according to claim 19 in which the insulator is silica, ferrite, or polytetrafluoroethylene and the metal is gold.

21. A method according to claim 3 in which the film is applied to insulator by evaporation and forms a weakly adherent bond and the film is readily peelable from the surface of the insulator before irradiation.

22. A laminate according to claim 18 in which the second layer is an evaporated, thin film of metal readily peelable before irradiation.

* * * * *